(12) United States Patent
Jeong et al.

(10) Patent No.: US 10,460,852 B2
(45) Date of Patent: Oct. 29, 2019

(54) ELECTRODE HAVING NANO MESH MULTI-LAYER STRUCTURE, USING SINGLE CRYSTAL COPPER, AND MANUFACTURING METHOD THEREFOR

(71) Applicant: PUSAN NATIONAL UNIVERSITY INDUSTRIAL-UNIVERSITY COOPERATION FOUNDATION, Busan (KR)

(72) Inventors: Se-young Jeong, Busan (KR); Ji-young Kim, Yangsan-si (KR); Won-kyung Kim, Busan (KR)

(73) Assignee: PUSAN NATIONAL UNIVERSITY INDUSTRIAL-UNIVERSITY COOPERATION FOUNDATION (KR)

( * ) Notice: Subject to any disclaimer, the term of this patent is extended or adjusted under 35 U.S.C. 154(b) by 412 days.

(21) Appl. No.: 15/305,735

(22) PCT Filed: Jan. 9, 2015

(86) PCT No.: PCT/KR2015/000242
§ 371 (c)(1),
(2) Date: Oct. 21, 2016

(87) PCT Pub. No.: WO2015/147429
PCT Pub. Date: Oct. 1, 2015

(65) Prior Publication Data
US 2017/0186511 A1 Jun. 29, 2017

(30) Foreign Application Priority Data
Mar. 26, 2014 (KR) .................. 10-2014-0035320

(51) Int. Cl.
*H01B 1/08* (2006.01)
*H01B 5/14* (2006.01)
(Continued)

(52) U.S. Cl.
CPC ............. *H01B 5/14* (2013.01); *C23C 14/086* (2013.01); *C23C 14/205* (2013.01); *C23C 14/34* (2013.01);
(Continued)

(58) Field of Classification Search
CPC ...................................... C23C 14/34
See application file for complete search history.

(56) References Cited

U.S. PATENT DOCUMENTS

2008/0041813 A1* 2/2008 Oladeji ................. C09K 13/06
216/13
2009/0242887 A1* 10/2009 Yamamoto ........... C23C 14/086
257/59

(Continued)

FOREIGN PATENT DOCUMENTS

JP      61-000591 A    1/1986
JP      2012142500 A *   7/2012
(Continued)

OTHER PUBLICATIONS

"Copper Better than Silver: Electrical Resistivity of the Grain-Free Single-Crystal Copper Wire," Cho et al., Crystal Growth & Design, vol. 10, No. 6, 2010.*

(Continued)

*Primary Examiner* — Ian A Rummel
(74) *Attorney, Agent, or Firm* — Park & Associates IP Law, P.C.

(57) ABSTRACT

The present invention relates to an electrode having a multilayer nanomesh structure using single-crystalline copper and a method for manufacturing same, the electrode comprising: a substrate; a single-crystalline copper electrode layer formed on the substrate and having a hive-shaped pattern with a nano-sized line width; and a metal oxide layer formed on the single-crystalline copper electrode layer, this (Continued)

providing an electrode having excellent optical transmittance, low electrical sheet resistance, and excellent mechanical stability. The present invention is technically characterized by an electrode having a multilayer nanomesh structure using single-crystalline copper, the electrode comprising: a substrate; a single-crystalline copper electrode layer formed on the substrate and having a hive-shaped pattern with a nano-sized line width; and a metal oxide layer formed on the single-crystalline copper electrode layer.

9 Claims, 6 Drawing Sheets

(51) Int. Cl.
| | | |
|---|---|---|
| H01B 13/00 | (2006.01) | |
| C23C 14/34 | (2006.01) | |
| C30B 29/02 | (2006.01) | |
| C30B 33/10 | (2006.01) | |
| C23C 14/08 | (2006.01) | |
| C23C 14/20 | (2006.01) | |
| H01B 1/02 | (2006.01) | |
| C30B 23/08 | (2006.01) | |
| H01L 31/0224 | (2006.01) | |
| H01L 51/00 | (2006.01) | |
| H01L 51/44 | (2006.01) | |
| H01L 51/52 | (2006.01) | |
| H01L 51/10 | (2006.01) | |

(52) U.S. Cl.
CPC ............ *C30B 23/08* (2013.01); *C30B 29/02* (2013.01); *C30B 33/10* (2013.01); *H01B 1/02* (2013.01); *H01B 1/08* (2013.01); *H01B 13/0036* (2013.01); *H01L 31/022466* (2013.01); *H01L 51/0023* (2013.01); *H01L 51/445* (2013.01); *H01L 51/5212* (2013.01); *H01L 51/102* (2013.01); *Y02E 10/549* (2013.01)

(56) References Cited

U.S. PATENT DOCUMENTS

2010/0041237 A1* 2/2010 Lee ................... H01L 21/31111
438/704
2013/0052121 A1* 2/2013 Hasegawa .............. B82Y 30/00
423/448

FOREIGN PATENT DOCUMENTS

| KR | 10-1998-0037011 A | 8/1998 |
|---|---|---|
| KR | 10-2007-0072215 A | 7/2007 |
| KR | 10-2012-0079803 A | 7/2012 |
| KR | 10-1352779 B1 | 1/2014 |

OTHER PUBLICATIONS

Machine translation of JP2012142500.*
International Search Report(PCT/KR2015/000242), WIPO, dated Apr. 1, 2015.

* cited by examiner

ELECTRODE HAVING NANO MESH MULTI-LAYER STRUCTURE, USING SINGLE CRYSTAL COPPER, AND MANUFACTURING METHOD THEREFOR

REFERENCE TO RELATED APPLICATIONS

This application is a U.S. National Phase application of International Application No. PCT/KR2015/000242, filed Jan. 9, 2015, and claims priority to Korean Patent Application No. 10-2014-0035320, filed Mar. 26, 2014, the disclosures of each of these applications being incorporated herein by reference in their entireties.

FIELD OF THE INVENTION

The present invention relates to an electrode having a multilayer nanomesh structure made of single-crystalline copper and a method for manufacturing the same. More specifically, the present invention relates to an electrode having a multilayer nanomesh structure made of single-crystalline crystal copper and to a method for manufacturing the same, the electrode including: a substrate; a single-crystalline copper electrode layer formed on the substrate and having a hive-shaped pattern with a nano-sized line width; and a metal oxide layer formed on the single-crystalline copper electrode layer, thus the electrode has excellent optical transmittance, low electrical sheet resistance, and excellent mechanical stability.

BACKGROUND OF THE INVENTION

A transparent electrode for use in solar cells, displays, touch screens, and so on is an electrode formed by depositing a conductive metal thin film on a transparent film or glass substrate so as to be transparent and electrically conductive.

Among transparent electrodes, an ITO electrode is mainly used and it is formed by depositing an indium tin oxide thin film on a transparent substrate. ITO has disadvantages of high manufacturing cost due to high prices of indium and of poor durability and flexibility due to chemical instability.

In order to solve these problems, i.e., to replace ITO electrodes, alternative transparent electrodes made of various different materials and having various structures have been studied and developed to have excellent durability and flexibility.

Transparent electrodes that have been developed so far are electrodes formed by depositing a metal thin film using silver, platinum, gold, copper, and the like or a combination thereof instead of indium, on a transparent substrate.

Among conventional transparent electrodes, a transparent electrode made of polycrystalline copper has an advantage of low manufacturing cost due to the low price of copper. However, it has disadvantages of structural defects and nonuniform grains attributed to the polycrystalline structure. Therefore, with the use of polycrystalline copper, it was impossible to form a thin film with a nano-sized line width. Furthermore, polycrystalline copper cannot be applied to flexible devices due to low mechanical stability and flexibility, which increase sheet resistance when the sheet is being bent.

SUMMARY OF THE INVENTION

Technical Problem

Accordingly, the present invention has been made keeping in mind the above problems occurring in the prior art, and an object of the present invention is to provide an electrode having a multilayer nanomesh structure made of single-crystalline copper and a method for manufacturing the same, thereby eliminating structural defects and non-uniform grains to enable formation of a copper thin film with a nano-sized line width and improving mechanical stability to prevent an increase in sheet resistance attributable to bending deformation and to guarantee flexibility.

The objects of the present invention are not limited to ones described above and other objects and features can be understood from the following description.

Technical Solution

In order to accomplish the above objects, according to one aspect, there is provided an electrode having a multilayer nanomesh structure made of single-crystalline copper, the electrode including: a substrate; a single-crystalline copper electrode layer formed on the substrate and having a hive-shaped pattern with a nano-sized line width; and a metal oxide layer formed on the single-crystalline copper electrode layer.

The substrate may be a polyimide substrate or a polyethylene terephthalate substrate.

The single-crystalline copper electrode layer may have a thickness of 30 to 150 nm.

The metal oxide is a chemical compound of zinc oxide (ZnO) or aluminum-doped zinc oxide (AZO).

According to another aspect, there is provided a method for manufacturing an electrode having a multilayer nanomesh structure made of single-crystalline copper, the method including: a first step of depositing a single-crystalline copper thin film on a substrate through high frequency sputtering or direct current sputtering; a second step of forming a photoresist liquid mask having a hive-shaped pattern on the single-crystalline copper thin film formed on the substrate through ultraviolet lithography; a third step of forming a single-crystalline copper electrode layer having a hive-shaped pattern that corresponds to the pattern of the photoresist liquid mask and has a nano-sized line width smaller than that of the photoresist liquid mask, on the polyimide substrate by dipping the single-crystalline copper thin film with the photoresist liquid mask formed thereon in an etching solution to cause over-etching and undercutting; a fourth step of removing the photoresist liquid mask from the single-crystalline copper electrode layer using acetone and rinsing the substrate and the single-crystalline copper electrode layer using ethanol and distilled water; and a fifth step of forming a metal oxide layer by deposing a metal oxide on the single-crystalline copper electrode layer from which the photoresist liquid mask is removed, through high frequency sputtering.

The high frequency sputtering of the first step may be performed at 120 to 180° C. and 30 to 60 W for 5 to 10 minutes, thereby forming the single-crystalline copper thin film having a thickness of 30 to 150 nm.

The etching solution may be a solution in which distilled water, hydrogen peroxide, and acetic acid are mixed in a volume mixing ratio of 10 to 100:1:1.

The high frequency sputtering of the fifth step may be performed at 120 to 180° C. and 20 to 40 W for 10 to 300 minutes to form the metal oxide layer having a thickness of 20 to 300 nm.

The metal oxide may be a chemical compound of zinc oxide (ZnO) or aluminum-doped zinc oxide (AZO).

Advantageous Effects

The present invention having the structure described above greatly improves optical characteristics, electrical characteristics, and mechanical stability of an electrode by using a multilayer nanomesh structure made of single-crystalline copper and a metal oxide, thereby providing an electrode that has sufficient quality to be applied to flexible devices at low manufacturing cost and providing a method for manufacturing the electrode.

DETAILED DESCRIPTION OF THE INVENTION

Best Mode

The present invention relates to an electrode having a multilayer nanomesh structure made of single-crystalline copper, thereby not having structural defects and non-uniform grains attributable to polycrystalline copper and having improved mechanical stability, thereby having sufficient quality to be applied to flexible devices, and to a method for manufacturing same.

Hereinafter, an electrode having a multilayer nanomesh structure made of single-crystalline copper according to the present invention and a method for manufacturing an electrode having a multilayer nanomesh structure made of single-crystalline copper according to the present invention will be described in detail with reference to the accompanying drawings.

First, an electrode having a multilayer nanomesh structure made of single-crystalline copper according to the present invention will be described first.

Figure 1:
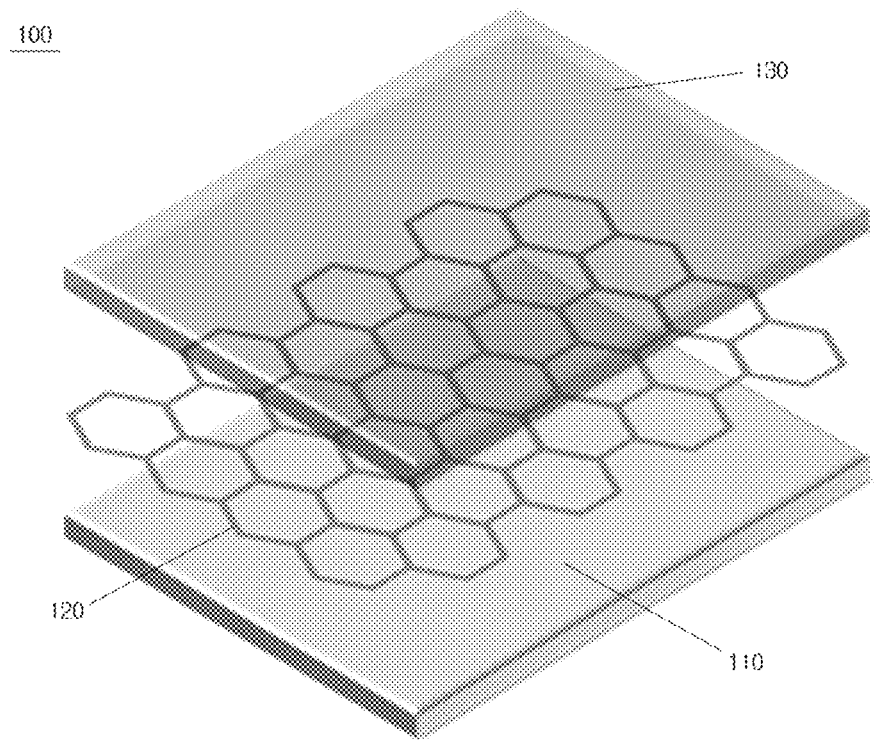
FIG. 1 is a schematic view illustrating the structure of an electrode having a multilayer nanomesh structure made of single-crystalline copper according to one embodiment of the present invention.

FIG. 1 is a schematic view illustrating the structure of an electrode having a multilayer nanomesh structure made of single-crystalline copper according to the present invention.

As illustrated in FIG. 1, an electrode 100 having a multilayer nanomesh structure made of single-crystalline copper according to the present invention may include a substrate 110, a single-crystalline copper electrode layer 120, and a metal oxide layer 130.

The substrate 110 may have a thickness of 50 to 200 μm and be made of a flexible or nonflexible material. When the substrate 110 is made of a flexible material, a flexible electrode can be formed.

The substrate 110 may be transparent or may not be transparent. When the substrate 110 is transparent, a transparent electrode can be formed.

The substrate 110 may be a polyimide (PI) substrate or a polyethylene terephthalate (PET) substrate that meets the required characteristics of material described above and is stable in terms of structure and chemical state.

The single-crystalline copper electrode layer 120 is formed by depositing single-crystalline copper on the substrate 110 through high frequency sputtering or direct current sputtering. The single-crystalline copper formed on the substrate 110 has a thickness of 30 to 150 nm and serves as an electrode through which electrical current flows.

The single-crystalline copper electrode layer 120 has a hive-shaped pattern with a nano-sized line width to guarantee that the electrode can be transparent and flexible. The single-crystalline copper to form the single-crystalline copper electrode layer 120 is grown from molten copper using the Czochralski method or Bridgeman method.

The hive-shaped pattern provides higher transmittance because of use of a relatively small amount of single-crystalline copper per unit area of an electrode compared to circular, triangular, rectangular patterns. In addition, the hive-shaped pattern has excellent mechanical properties compared to other shapes of patterns and thus can better withstand high pressures, bending, and creeping.

In addition, the hive-shaped pattern can reduce manufacturing cost and improve optical characteristics and mechanical characteristics compared to circular, triangular, and rectangular patterns.

The metal oxide layer 130 is formed by depositing a metal oxide on the single-crystalline copper electrode layer 120 to a thickness of 20 to 100 nm through high frequency sputtering. The metal oxide layer 130 prevents the single-crystalline copper electrode layer 120 from being oxidized by oxygen in the air and reduces electrical sheet resistance of the single-crystalline copper electrode layer 120.

The metal oxide used to form the metal oxide layer 130 may be a chemical compound such as a zinc oxide (ZnO) or an aluminum-doped zinc oxide (AZO) with an aluminum concentration of 1 to 2 mol %.

Next, a method for manufacturing an electrode having a multilayer nanomesh structure made of single-crystalline copper will be described.

Figure 2:
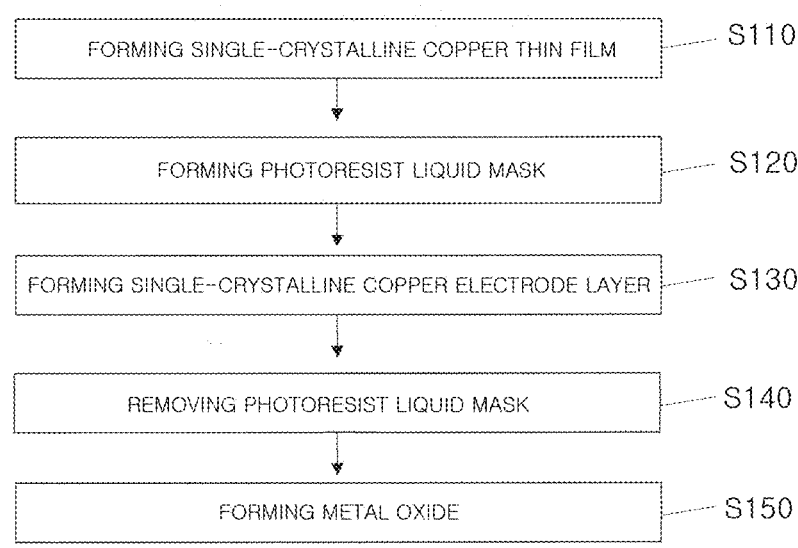
FIG. 2 is a flowchart illustrating a method for manufacturing an electrode having a multilayer nanomesh structure made of single-crystalline copper according to one embodiment of the present invention.
Figure 3:
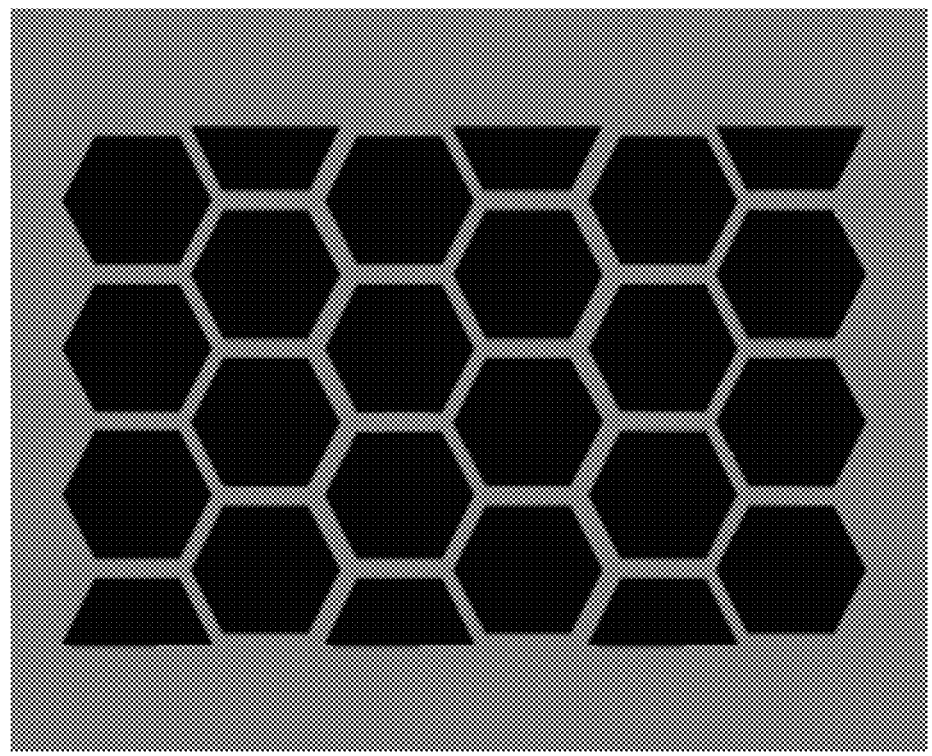
FIG. 3 is a schematic view illustrating the structure of a photoresist liquid mask for use in the method for manufacturing the electrode having a multilayer nanomesh structure made of single-crystalline copper according to the embodiment of the present invention.
Figure 4:
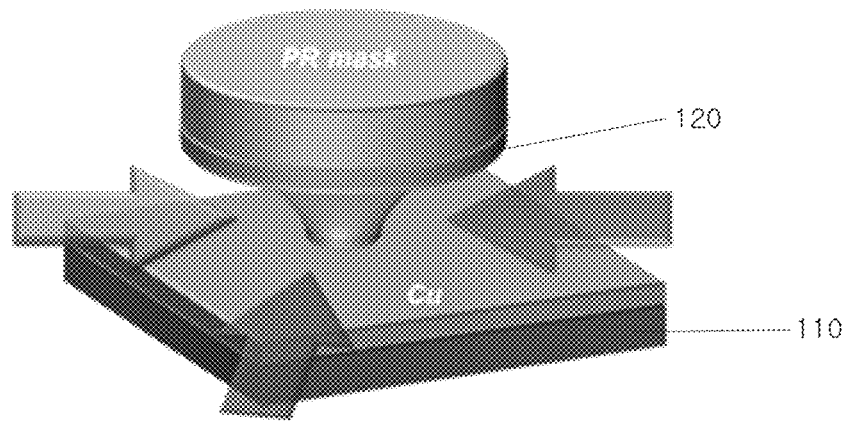
FIG. 4 is an exemplary diagram illustrating an undercut phenomenon attributable to an over-etching process that is included in the method for manufacturing the electrode having a multilayer nanomesh structure made of single-crystalline copper according to the embodiment of the present invention.
Figure 4:
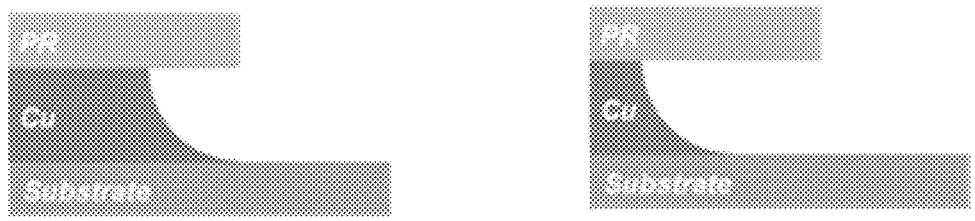

FIG. 2 is a flowchart illustrating the method for manufacturing an electrode having a multilayer nanomesh structure made of single-crystalline copper according to one embodiment of the present invention; FIG. 3 is a schematic view illustrating the structure of a photoresist liquid mask for use in the method for manufacturing the electrode having a multilayer nanomesh structure made of single-crystalline copper according to the embodiment of the present invention; and FIG. 4 is an exemplary diagram illustrating an undercut phenomenon attributable to an over-etching process that is included in the method for manufacturing the electrode having a multilayer nanomesh structure made of single-crystalline copper according to the embodiment of the present invention.

As illustrated in FIG. 2, a method S100 for manufacturing an electrode having a multilayer nanomesh structure made of single-crystalline copper according to the present invention includes: a first step S110 of forming a single-crystalline copper thin film; a second step S120 of forming a photoresist liquid mask; a third step S130 of forming a single-crystalline copper electrode layer; a fourth step S140 of removing the photoresist liquid mask; and a fifth step S150 of forming a metal oxide layer.

The first step S110 is a step of forming a single-crystalline copper thin film by depositing single-crystalline copper on a substrate through a physical vapor deposition (PVD) process.

The physical vapor deposition process may use high frequency sputtering or direct current sputtering that can make the most of characteristics of single-crystalline copper and enables deposition over a large area at a time.

When high frequency sputtering is used, the deposition is performed at 120 to 180° C. and 30 to 60 W for 5 to 10 minutes. If the deposition is performed above or under the described temperature range, the substrate is likely to be deformed or single-crystalline copper is likely to be oxidized or deteriorated in its crystalline and electrical characteristics. On the other hand, if the power is higher or lower than the described power range during the deposition process, the single-crystalline copper thin film that is formed may not be uniform or may have poor electrical or mechanical characteristics. If the time length for the deposition process is longer or shorter than the described range, the single-crystalline copper thin film is thicker or thinner than the desired thickness. Therefore, it is preferable that the high frequency sputtering should be performed within the described temperature, power, and time ranges.

The second step S120 is a process of forming a photoresist liquid mask having a hive-shaped pattern on the single-crystalline copper thin film formed on the substrate through ultraviolet lithography.

The photoresist liquid mask may be formed such that the line width of the hive-shaped pattern is 3 to 5 µm and the diameter of an open area of the hive-shaped pattern is 5 to 30 µm. The reason why the photoresist liquid mask is formed to have a hive shape as illustrated in FIG. 3 is that the hive-shaped pattern can reduce manufacturing cost and improve optical and mechanical characteristics.

The third step S130 is a process of forming a single-crystalline copper electrode layer having a hive shape by wet-etching the single-crystalline copper thin film on which the photoresist liquid mask is formed.

That is, by performing wet etching using an etching solution and the pattern of the photoresist liquid mask, it is possible to turn the single-crystalline copper thin film into the single-crystalline copper electrode layer having a hive-shaped pattern.

The etching solution may be a mixture of distilled water, hydrogen peroxide, and acetic acid that are mixed in a volume mixing ratio of 10 to 100:1:1.

Here, the single-crystalline copper electrode layer is preferably formed to have a line width smaller than that of the photoresist liquid mask using an undercutting phenomenon that is caused by adjusting a dipping time during which the single-crystalline copper thin film is dipped in the etching solution.

By using the undercutting achieved through over-etching, it is possible to form, on the substrate, the single-crystalline copper electrode layer having a nano structure having a line width smaller than that of the hive-shaped pattern of the photoresist liquid mask and an open area larger than that of the hive-shaped pattern of the photoresist liquid mask.

In addition, it is possible to easily manufacture the nano structure at low manufacturing cost by using only ultraviolet lithography and wet etching that are general technologies, without using electron beam lithography or nanoimprint lithography that use expensive equipment.

The fourth step S140 is a process of removing the photoresist liquid mask from the single-crystalline copper electrode layer and rinsing the single-crystalline copper electrode layer.

In this process, the photoresist liquid mask is first removed from the upper part of the single-crystalline copper electrode layer using acetic acid. Subsequently, the substrate and the single-crystalline copper electrode layer on which the residual acetic acid remains are rinsed firstly with ethanol and secondly with distilled water.

The fifth step S150 is a process of forming a metal oxide layer by depositing a metal oxide on the single-crystalline copper electrode layer, from which the photoresist liquid mask is removed, through high frequency sputtering.

In this process, a chemical compound such as zinc oxide (ZnO) or aluminum-doped zinc oxide (AZO) may be used as the metal oxide.

The high frequency sputtering is performed at 120 to 180° C. and 20 to 40 W for 10 to 300 minutes. When the temperature is higher or lower than the described range, the substrate may be deformed, or crystalline, electrical, and optical characteristics of the metal oxide may be deteriorated. When the power is higher or lower than the described range, the metal oxide may not be uniformly deposited, which deteriorates electrical and optical characteristics of the metal oxide. On the other hand, when the sputtering time is longer or shorter than the described range, the metal oxide layer that is formed may be excessively thick or thin. Therefore, it is preferable that the high frequency should be performed under the described temperature, power, and time conditions.

Hereinafter, the method for manufacturing an electrode having a multilayer nanomesh structure made of single-crystalline copper according to the present invention will be described with reference to a preferred embodiment.

1. Step of Forming Single-Crystalline Thin Film

High frequency sputtering is performed using a single-crystalline copper target. The sputtering is performed at 150° C. and 50 W for 8 minutes, thereby forming a single-crystalline copper thin film having a thickness of 80 nm on a flexible polyimide substrate.

2. Step of Forming Photoresist Liquid Mask

Ultraviolet lithography is performed to form a photoresist liquid mask on the single-crystalline copper thin film formed on the polyimide substrate, wherein the photoresist liquid mask has a hive-shaped pattern with a line width of 3 μm and a diameter of a hive of 5 μm to 30 μm.

3. Forming Single-crystalline Copper Electrode Layer

Overetching to cause undercutting is performed by dipping the single-crystalline copper thin film on which the photoresist liquid mask is formed for 10 to 300 seconds in an etching solution in which distilled water, hydrogen peroxide, and acetic acid are mixed in a volume mixing ratio of 10:1:1, thereby forming the single-crystalline copper electrode layer on the polyimide substrate, wherein the single-crystalline copper electrode has a pattern corresponding to the pattern of the photoresist liquid mask and has a line width of 3 μm to 200 nm narrower than that of the photoresist liquid mask.

4. Step of Removing Photoresist Liquid Mask

The photoresist liquid mask formed on the single-crystalline copper electrode layer is removed using acetic acid. Next, the polyimide substrate and the single-crystalline copper electrode layer are firstly rinsed with ethanol and secondly rinsed with distilled water, so that impurities such as acetic acid remaining on the polyimide substrate and the single-crystalline copper electrode layer are removed.

5. Step of Forming Metal Oxide Layer

A chemical compound of zinc oxide doped with 2 mol % of aluminum is subjected to high frequency sputtering performed at 150° C. and 30 W for 20 minutes, thereby forming a zinc oxide layer doped with aluminum and having a thickness of 50 nm on the single-crystalline copper electrode layer.

Through this step, the single-crystalline copper electrode layer having a thickness of 80 nm and a line width of 3 μm to 200 nm and the aluminum-doped zinc oxide layer having a thickness of 50 nm are sequentially formed on the polyimide substrate.

The results of performance analysis of the electrode having a multilayer nanomesh structure made of single-crystalline copper according to the preferred embodiment will be described with reference to the accompanying drawings.

Figure 5:
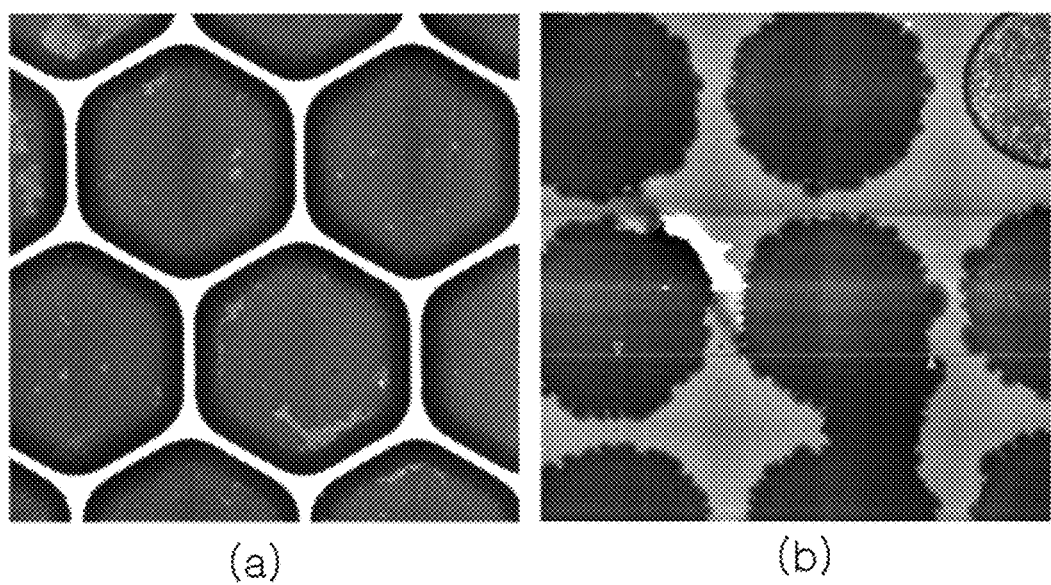
FIGS. 5(a) and 5(b) show atomic force microscope (AFM) surface images to compare a single-crystalline copper electrode layer made of single-crystalline copper according to a preferred embodiment of the present invention and a polycrystalline copper electrode layer made of polycrystalline copper.

FIG. 5 shows atomic force microscope (AFM) surface images to compare a single-crystalline copper electrode layer made of single-crystalline copper according to the preferred embodiment of the present invention with a poly crystal copper electrode layer made of poly crystal copper.

According to FIG. 5, the single-crystalline copper electrode layer made of single-crystalline copper (shown in FIG. 5a) according to the present invention has a hive-shaped pattern that is uniform but the polycrystalline copper electrode made of polycrystalline copper (shown in FIG. 5b) according to the comparative example has a hive-shaped pattern that is nonuniform, unstable, and chaotic due to structural defects and non-uniform grains exiting in the electrode.

That is, it is possible to find the electrode layer uniformly overetched to have a uniform hive-shaped pattern by forming the electrode layer using single-crystalline copper.

Figure 6:
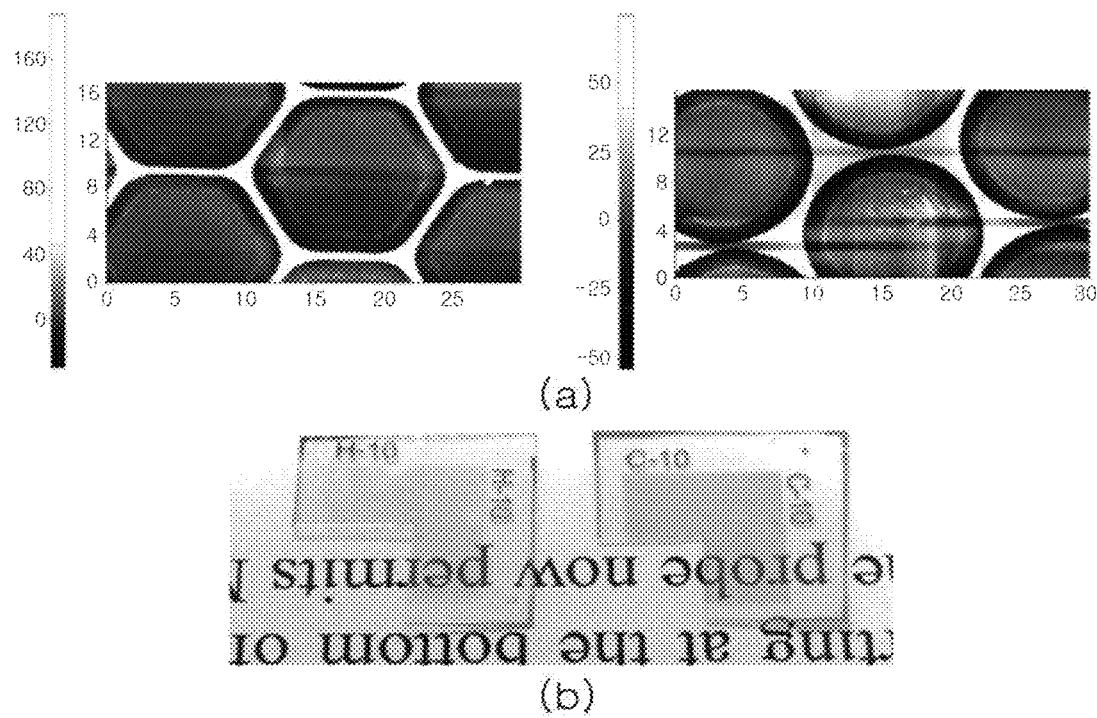
FIGS. 6(a) and 6(b) show AFM surface images and photographs to compare a single-crystalline copper electrode layer having a hive-shaped pattern according to a preferred embodiment of the present invention and a polycrystalline copper electrode layer having a circular pattern.

FIG. 6 shows AFM surface images a and photographs b to compare a single-crystalline copper electrode layer having a hive-shaped pattern according to a preferred embodiment of the present invention and a single-crystalline copper electrode layer having a circular pattern according to a comparative example.

According to FIG. 6a, the single-crystalline copper electrode layer (left side) having a hive-shaped pattern according to the present invention has a uniform line width at positions where adjacent hives overlap each other. On the other hand, the single-crystalline copper electrode layer (right side) having a circular pattern according to the comparative example has a thicker line width at positions where hives overlap each other than at other positions.

Therefore, according to FIG. 6b, it is possible to find that the single-crystalline copper electrode layer (left side) having a hive-shaped pattern has higher optical transmittance than the single-crystalline copper electrode layer (right side) having a circular pattern.

Figure 7:
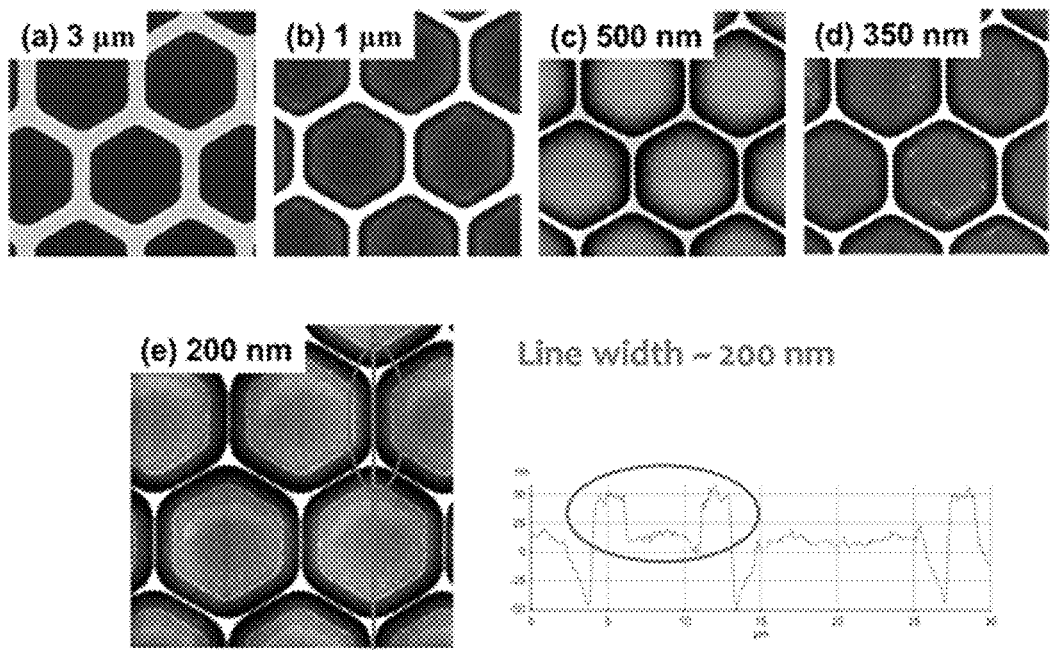
FIGS. 7(a)-7(e) show AFM surface images of single-crystalline copper electrode layers having hive-shaped patterns that have different line widths according to preferred embodiments of the present invention.

FIG. 7 shows AFM surface images showing single-crystalline copper electrode layers having hive-shaped patterns with different line widths according to preferred embodiments of the present invention.

According to FIG. 7, single-crystalline copper electrode layers with different line widths are formed by adjusting etching periods as shown in FIGS. 7a, 7b, 7c, and 7d. When the line width is 200 nm or less, the shape of the hive pattern of the single-crystalline copper electrode is not neat, which means that a conduction path is broken and resistance is increased.

Figure 8:
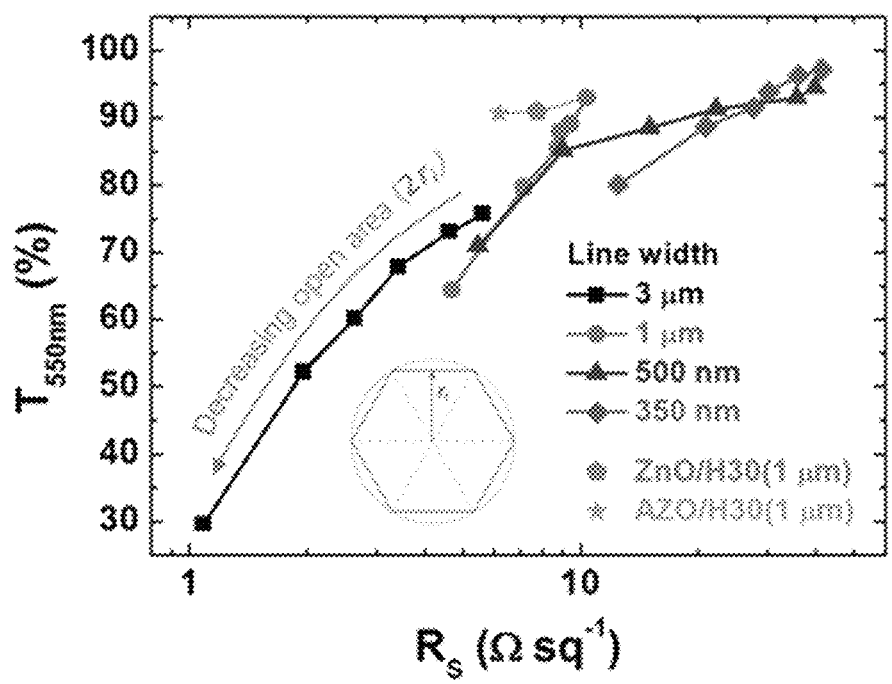
FIG. 8 is a graph illustrating electrical and optical characteristics of electrodes having different line widths and open area diameters, according to preferred embodiments of the present invention.

FIG. 8 is a graph illustrating electrical and optical characteristics of electrodes with various line widths and open area diameters in their patterns, which are manufactured according to preferred embodiments of the present invention.

According to FIG. 8, sheet resistance and transmittance of electrodes that have a line width selected from among 3 μm, 2 μm, 500 nm, 350 nm and a diameter of an open area selected from among 5 μm, 10 μm, 15 μm, 20 μm, 25 μm, 30 μm were measured. From the measurement results, it is found that as the line width is increased, the sheet resistance is decreased with the diameter of an open area fixed, and that as the diameter of an open area is increased the transmittance is increased with the line width fixed.

That is, it is found that the electrical characteristic is proportional to the line width and the optical characteristic is proportional to the diameter of an open area.

Figure 9:
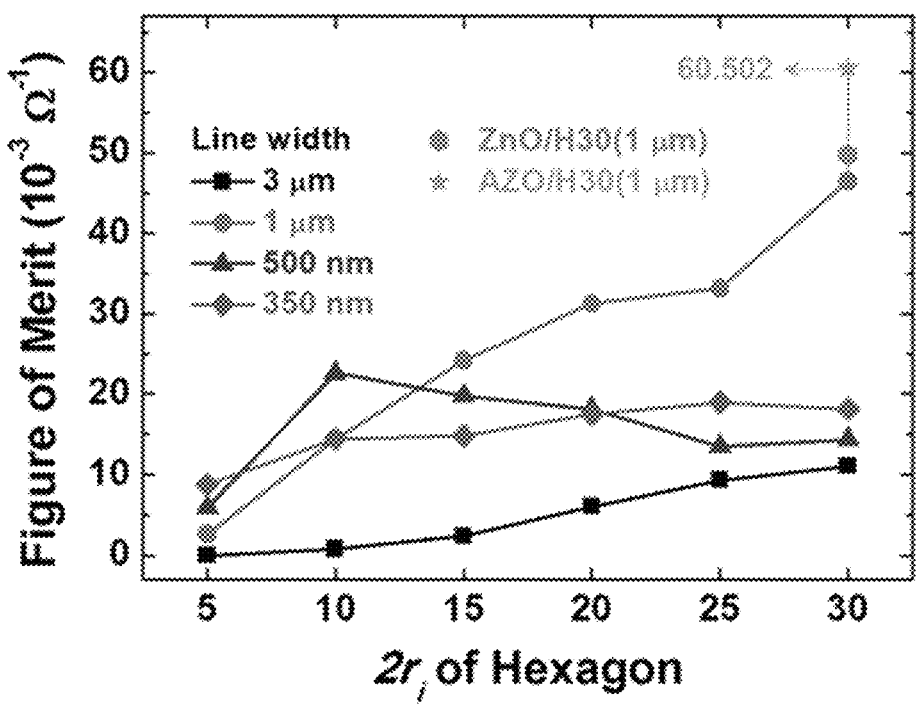
FIG. 9 is a graph illustrating figures of merit of electrodes having different line widths and open area diameters, according to preferred embodiments of the present invention.

FIG. 9 is a graph illustrating figures of merit of electrodes with various line widths and various open area diameters, manufactured according to preferred embodiments of the present invention.

The figure of merit was calculated by selecting a sample with the best performance in terms of transmittance and sheet resistance.

According to FIG. 9, the electrode has the highest figure of merit of $46.473 \times 10^{-3}$ ohm$^{-1}$ when the line width is 1 μm and the open area diameter is 30 μm (H30 (1 μm)). In this case, the transmittance and sheet resistance of the sample was 92.962% and 10.372 ohm/sq respectively.

When zinc oxide (Zn) and aluminum-doped zinc oxide (AZO) are deposited on the H30 (1 μm) sample with the highest figure of merit, the transmittance was reduced to 90.908% and 90.656%, respectively. However, the sheet resistance was increased to 7.747 ohm/sq and 6.197 ohm/sq, respectively and the figure of merit was improved to $49.893 \times 10^{-3}$ ohm$^{-1}$ and $60.502 \times 10^{-3}$ ohm$^{-1}$ respectively.

That is, the transmittance is slightly reduced due to the metal oxide layer but the electrical characteristic is improved because the open area is filled with a conductive oxide to form a new conduction path. Especially, when the aluminum-doped zinc oxide (AZO) was deposited, the figure of merit was improved by about 30%.

Figure 10:
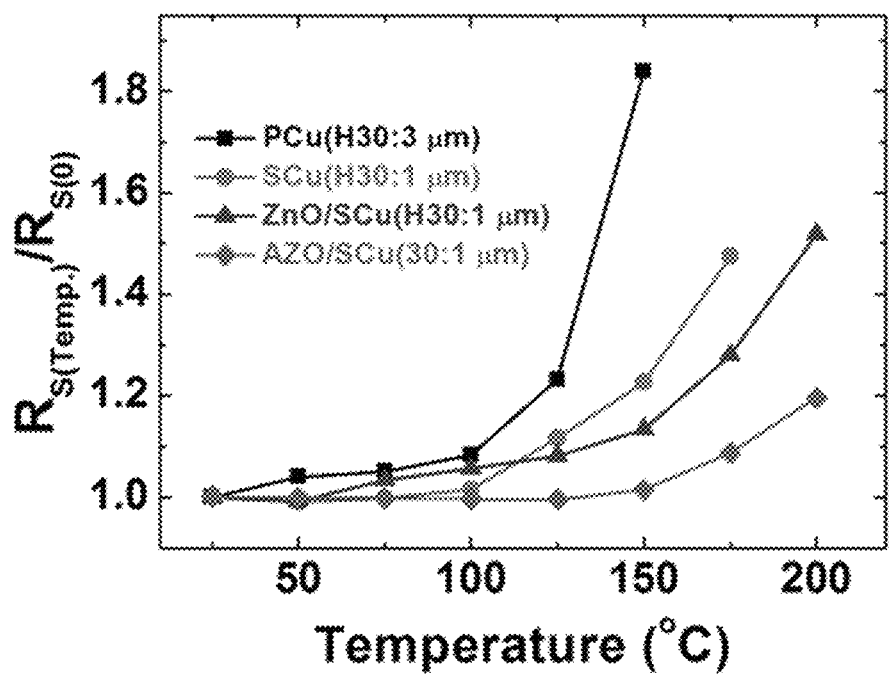
FIG. 10 is a graph illustrating chemical stability of an electrode according to a preferred embodiment of the present invention.

FIG. 10 is a graph illustrating chemical stability of an electrode according to a preferred embodiment of the present invention.

The sheet resistance was measured for a single-crystalline copper electrode layer and a polycrystalline copper electrode layer before and after a metal oxide was formed on the electrode layers while heating the electrode layers in the air from the room temperature to 200° C.

According to FIG. 10, the sheet resistance of the polycrystalline copper electrode layer without the metal oxide layer formed thereon was sharply increased from 125° C. and was too high to be measured from 150° C. On the other hand, an increase in the sheet resistance of the single-crystalline copper electrode layer without the metal oxide layer formed thereon was relatively small compared to the polycrystalline copper electrode layer. However, for the single-crystalline copper electrode layer, the sheet resistance was too high to be measured at 175° C. or higher because it was difficult to perfectly inhibit copper from being oxidized.

However, for the single-crystalline copper electrode layer with the metal oxide layer formed thereon, the sheet resistance was maintained low until the electrode layer was heated to 200° C. by which the substrate is not deformed. Specifically, the sheet resistance of the single-crystalline copper electrode layer with the metal oxide of aluminum-doped zinc oxide formed thereon was lower than that of the single-crystalline copper electrode layer with the metal oxide of zinc oxide formed thereon because aluminum replaces oxide and provides free electrons.

Figure 11:
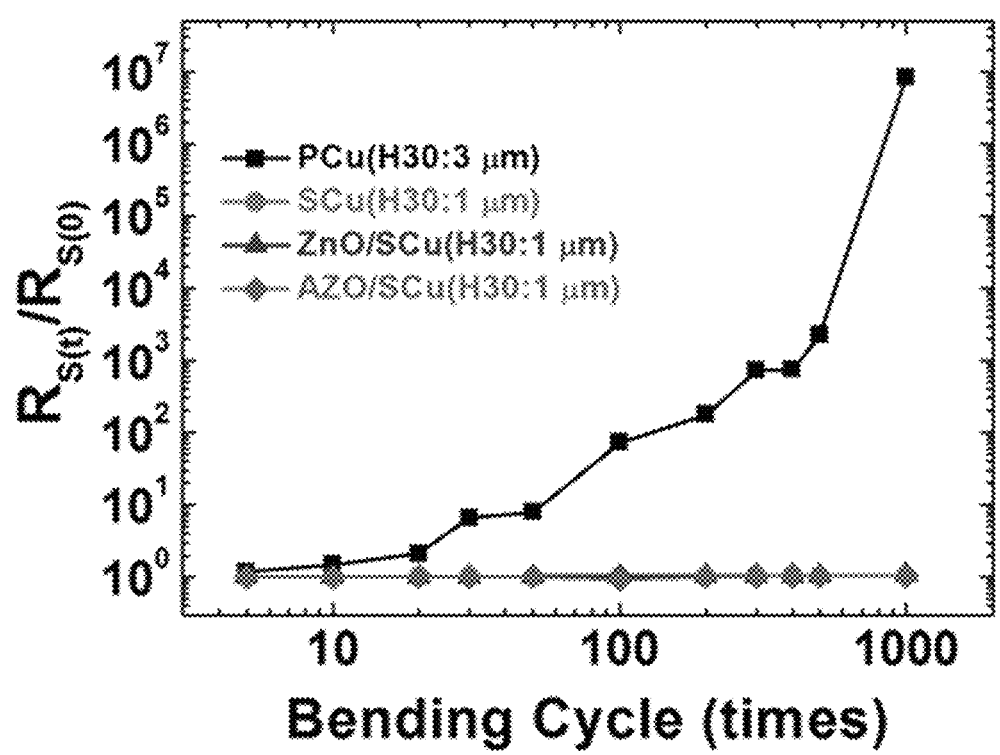
FIG. 11 is a graph illustrating flexibility of an electrode according to a preferred embodiment of the present invention.

FIG. 11 is a graph illustrating flexibility of an electrode according to a preferred embodiment of the present invention.

In order for an electrode to be applied flexible device, the electrode has to maintain its inherent physical characteristic even under mechanical stress. To verify it, a single-crystalline copper electrode with a metal oxide formed thereon and a polycrystalline copper electrode without a metal oxide formed thereon were bent 0 to 1000 times and after that the sheet resistance for them was measured.

According to FIG. 11, the polycrystalline copper electrode has low mechanical stability. Therefore, after it was bent 1000 times or more, the sheet resistance thereof increased 107 times compared to an initial sheet resistance. On the other hand, the sheet resistance of the single-crystalline copper electrode was 1.04 to 1.08 times an initial sheet resistance after it was bent 1000 times or more. That is, the initial sheet resistance is maintained regardless of the presence and absence of the oxide layer, thereby exhibiting excellent mechanical stability.

The described embodiments are only exemplary and thus the ordinary skilled in the art will appreciate that various modifications and changes to the embodiments are possible. Therefore, not only the described embodiments but also their modifications and equivalents should be included within the genuine protection scope of the present invention as defined in the appended claims.

INDUSTRIAL APPLICABILITY

The present invention relates to an electrode having a multilayer nanomesh structure made of single-crystalline copper and to a method for manufacturing the same. More specifically, the present invention can be applied to an electrode having a multilayer nanomesh structure made of single-crystalline copper and to a method for manufacturing the same, the electrode including: a substrate; a single-crystalline copper electrode layer formed on the substrate and having a hive-shaped pattern with a nano-sized line width; and a metal oxide layer formed on the single-crystalline copper electrode layer, thus providing an electrode having excellent optical transmittance, low electrical sheet resistance, and excellent mechanical stability.

What is claimed is:

1. An electrode having a multilayer nanomesh structure made of single-crystalline copper, the electrode comprising:
   a substrate;
   a single-crystalline copper electrode layer formed directly on the substrate using high frequency sputtering or direct current sputtering, and having a hexagonal pattern with a nano-sized line width achieved using over-wet-etching, for providing stability of the electrode which is applicable to flexible electrodes/devices by improving said stability over electrodes comprising a poly-crystalline copper electrode layer, said stability including at least temperature and flexing stability of a sheet resistance of the electrode comprising the single-crystalline copper electrode layer; and
   a metal oxide layer formed on the single-crystalline copper electrode layer.

2. The electrode according to claim 1, wherein the substrate is a polyimide substrate or a polyethylene terephthalate substrate.

3. The electrode according to claim 1, wherein the single-crystalline copper electrode layer has a thickness of 30 to 150 nm.

4. The electrode according to claim 1, wherein the metal oxide is a chemical compound of zinc oxide (ZnO) or aluminum-doped zinc oxide (AZO).

5. A method for manufacturing an electrode having a multiayer nanomesh structure of single-crystalline copper, the method comprising:
   a first step of forming a single-crystalline copper thin film directly on a substrate by depositing single-crystalline copper through high frequency sputtering or direct current sputtering;
   a second step of forming a photoresist liquid mask having a hexagonal pattern on the single-crystalline copper thin film formed on the substrate through ultraviolet lithography;
   a third step of forming the single-crystalline copper electrode layer having a matching hexagonal pattern that corresponds to the hexagonal pattern of the photoresist liquid mask and has a line width smaller than that of the photoresist liquid mask, on the substrate by performing overetching to cause undercutting by dipping the single-crystalline copper thin film on which the photoresist liquid mask is formed in an etching solution;
   a fourth step of removing the single-crystalline copper electrode layer from the photoresist liquid mask using acetic acid and rinsing the substrate and the single-crystalline copper electrode layer using ethanol and distilled water; and
   a fifth step of forming a metal oxide layer by depositing a metal oxide on the single-crystalline copper electrode layer from which the photoresist liquid mask is removed through high frequency sputtering;
   wherein the method provides stability of said electrode which is applicable to flexible electrodes/devices by improving said stability over electrodes comprising a poly-crystalline copper electrode layer, said stability including at least temperature and flexing stability of a sheet resistance of the electrode comprising the single-crystalline copper electrode layer.

6. The method according to claim 5, wherein the high frequency sputtering of the first step is performed at 120 to 180° C. and 30 to 60 W for 5 to 10 minutes, thereby forming the single-crystalline copper thin film having a thickness of 30 to 150 nm.

7. The method according to claim 5, wherein the etching solution is prepared by mixing distilled water, hydrogen peroxide, and acetic acid in a volume mixing ratio of 10 to 100:1:1.

8. The method according to claim 5, wherein the high frequency sputtering of the fifth step is performed at 120 to 180.degree. C. and 20 to 40 W for 10 to 300 minutes, thereby forming the metal oxide layer having a thickness of 20 to 300 nm.

9. The method according to claim 5, wherein the metal oxide is a chemical compound of zinc oxide (ZnO) or aluminum-doped zinc oxide (AZO).

* * * * *